(12) United States Patent
Guenther

(10) Patent No.: US 7,294,208 B2
(45) Date of Patent: Nov. 13, 2007

(54) APPARATUS FOR PROVIDING GAS TO A PROCESSING CHAMBER

(75) Inventor: Rolf A. Guenther, Monte Sereno, CA (US)

(73) Assignee: Applied Materials, Inc., Santa Clara, CA (US)

( * ) Notice: Subject to any disclaimer, the term of this patent is extended or adjusted under 35 U.S.C. 154(b) by 355 days.

(21) Appl. No.: 11/146,311

(22) Filed: Jun. 6, 2005

(65) Prior Publication Data
US 2005/0257735 A1 Nov. 24, 2005

Related U.S. Application Data

(63) Continuation of application No. 10/208,305, filed on Jul. 29, 2002, now Pat. No. 6,915,592.

(51) Int. Cl.
C23C 16/00 (2006.01)
F26B 17/00 (2006.01)
(52) U.S. Cl. .................................. 118/715; 118/726
(58) Field of Classification Search ................. 118/715, 118/726; 34/582
See application file for complete search history.

(56) References Cited

U.S. PATENT DOCUMENTS

| | | |
|---|---|---|
| 4,058,430 A | 11/1977 | Suntola et al. |
| 4,324,285 A | 4/1982 | Henderson |
| 4,389,973 A | 6/1983 | Suntola et al. |
| 4,413,022 A | 11/1983 | Suntola et al. |
| 4,415,275 A | 11/1983 | Dietrich |
| 4,579,699 A | 4/1986 | Verzemnieks |
| 4,588,449 A | 5/1986 | Sigler |
| 4,596,506 A | 6/1986 | Burgardt et al. |
| 4,605,566 A | 8/1986 | Matsui et al. |

(Continued)

FOREIGN PATENT DOCUMENTS

EP     1 167 569     1/2002

(Continued)

OTHER PUBLICATIONS

Arai, et al. "Abstract of Role of SiH$_4$ Gas Heating in the Growth of Hydrogenated Microcrystalline Silicon", Jpn J Appl Phys Part 2, vol. 35, No. 6A, pp. L676-L679, 1996.

(Continued)

Primary Examiner—Evan Pert
(74) Attorney, Agent, or Firm—Patterson & Sheridan LLP

(57) ABSTRACT

A method and apparatus for generating gas for a processing system is provided. In one embodiment, an apparatus for generating gas for a processing system includes a unitary, isolatable, transportable canister having a plurality of first spacing elements, a plurality of second spacing elements and a solid material disposed within the canister. The spacing elements have different mean diameters. The solid material is adapted to produce a gas vapor when exposed to a temperature above a predetermined level at a predetermined pressure. In another embodiment, an apparatus for generating gas includes a gas source coupled to a processing chamber by a first gas line. A canister is coupled in-line with the first gas line and contains a solid material that produces a process gas when heated. A heater is disposed between the gas source and the canister to heat gas flowing into the canister.

34 Claims, 5 Drawing Sheets

U.S. PATENT DOCUMENTS

| | | |
|---|---|---|
| 4,686,116 A | 8/1987 | Rickborn et al. |
| 4,712,600 A | 12/1987 | Hamajima et al. |
| 4,752,504 A | 6/1988 | Rickborn |
| 4,761,269 A | 8/1988 | Conger et al. |
| 4,817,557 A | 4/1989 | Diem et al. |
| 4,834,831 A | 5/1989 | Nishizawa et al. |
| 4,975,252 A | 12/1990 | Nishizawa et al. |
| 4,993,357 A | 2/1991 | Scholz |
| 5,039,392 A | 8/1991 | Bearden, Jr. et al. |
| 5,053,376 A | 10/1991 | Bearden, Jr. et al. |
| 5,055,436 A | 10/1991 | Klemptner et al. |
| 5,122,505 A | 6/1992 | Gusman et al. |
| 5,225,366 A | 7/1993 | Yoder |
| 5,261,959 A | 11/1993 | Gasworth |
| 5,281,274 A | 1/1994 | Yoder |
| 5,294,286 A | 3/1994 | Nishizawa et al. |
| 5,316,619 A | 5/1994 | Mastrangelo |
| 5,321,260 A | 6/1994 | Goldstein et al. |
| 5,338,362 A | 8/1994 | Imahashi |
| 5,369,544 A | 11/1994 | Mastrangelo |
| 5,374,570 A | 12/1994 | Nasu et al. |
| 5,377,429 A | 1/1995 | Sandhu et al. |
| 5,409,569 A | 4/1995 | Seki et al. |
| 5,441,703 A | 8/1995 | Jurgensen |
| 5,443,647 A | 8/1995 | Aucoin et al. |
| 5,470,797 A | 11/1995 | Mastrangelo |
| 5,480,818 A | 1/1996 | Matsumoto et al. |
| 5,483,919 A | 1/1996 | Yokoyama et al. |
| 5,502,092 A | 3/1996 | Barrows et al. |
| 5,503,875 A | 4/1996 | Imai et al. |
| 5,668,188 A | 9/1997 | Whinnery et al. |
| 5,674,574 A | 10/1997 | Atwell et al. |
| 5,674,786 A | 10/1997 | Turner et al. |
| 5,700,379 A | 12/1997 | Biebl |
| 5,711,811 A | 1/1998 | Suntola et al. |
| 5,730,802 A | 3/1998 | Ishizumi et al. |
| 5,770,018 A | 6/1998 | Saidi |
| 5,796,116 A | 8/1998 | Nakata et al. |
| 5,807,792 A | 9/1998 | Ilg et al. |
| 5,820,680 A | 10/1998 | Miyamoto et al. |
| 5,835,677 A | 11/1998 | Li et al. |
| 5,855,680 A | 1/1999 | Soininen et al. |
| 5,879,459 A | 3/1999 | Gadgil et al. |
| 5,904,771 A | 5/1999 | Tasaki et al. |
| 5,916,365 A | 6/1999 | Sherman |
| 5,923,056 A | 7/1999 | Lee et al. |
| 5,976,489 A | 11/1999 | Saidi et al. |
| 5,989,305 A | 11/1999 | Ohsaki et al. |
| 6,013,553 A | 1/2000 | Wallace et al. |
| 6,015,590 A | 1/2000 | Suntola et al. |
| 6,015,917 A | 1/2000 | Bhandari et al. |
| 6,042,652 A | 3/2000 | Hyun et al. |
| 6,060,755 A | 5/2000 | Ma et al. |
| 6,084,302 A | 7/2000 | Sandhu |
| 6,107,198 A | 8/2000 | Lin et al. |
| 6,110,814 A | 8/2000 | Tokumasu et al. |
| 6,124,158 A | 9/2000 | Dautartas et al. |
| 6,139,700 A | 10/2000 | Kang et al. |
| 6,143,659 A | 11/2000 | Leem |
| 6,144,060 A | 11/2000 | Park et al. |
| 6,162,501 A | 12/2000 | Kim |
| 6,174,377 B1 | 1/2001 | Doering et al. |
| 6,174,809 B1 | 1/2001 | Kang et al. |
| 6,183,563 B1 | 2/2001 | Choi et al. |
| 6,197,683 B1 | 3/2001 | Kang et al. |
| 6,200,893 B1 | 3/2001 | Sneh |
| 6,203,613 B1 | 3/2001 | Gates et al. |
| 6,207,487 B1 | 3/2001 | Kim et al. |
| 6,231,672 B1 | 5/2001 | Choi et al. |
| 6,238,734 B1 | 5/2001 | Senzaki et al. |
| 6,248,434 B1 | 6/2001 | Rödiger et al. |
| 6,261,679 B1 | 7/2001 | Chen et al. |
| 6,265,026 B1 | 7/2001 | Wang |
| 6,270,572 B1 | 8/2001 | Kim et al. |
| 6,284,646 B1 | 9/2001 | Leem |
| 6,287,965 B1 | 9/2001 | Kang et al. |
| 6,290,864 B1 | 9/2001 | Patel et al. |
| 6,297,539 B1 | 10/2001 | Ma et al. |
| 6,302,965 B1 | 10/2001 | Umotoy et al. |
| 6,305,314 B1 | 10/2001 | Sneh et al. |
| 6,306,216 B1 | 10/2001 | Kim et al. |
| 6,342,277 B1 | 1/2002 | Sherman |
| 6,348,376 B2 | 2/2002 | Lim et al. |
| 6,348,386 B1 | 2/2002 | Gilmer |
| 6,358,829 B2 | 3/2002 | Yoon et al. |
| 6,365,231 B2 | 4/2002 | Sato et al. |
| 6,372,598 B2 | 4/2002 | Kang et al. |
| 6,379,748 B1 | 4/2002 | Bhandari et al. |
| 6,391,785 B1 | 5/2002 | Satta et al. |
| 6,391,803 B1 | 5/2002 | Kim et al. |
| 6,399,491 B2 | 6/2002 | Jeon et al. |
| 6,416,577 B1 | 7/2002 | Suntola et al. |
| 6,416,822 B1 | 7/2002 | Chiang et al. |
| 6,428,859 B1 | 8/2002 | Chiang et al. |
| 6,447,607 B2 | 9/2002 | Soininen et al. |
| 6,451,119 B2 | 9/2002 | Sneh et al. |
| 6,451,695 B2 | 9/2002 | Sneh |
| 6,468,924 B2 | 10/2002 | Lee et al. |
| 6,475,276 B1 | 11/2002 | Elers et al. |
| 6,475,910 B1 | 11/2002 | Sneh |
| 6,478,872 B1 | 11/2002 | Chae et al. |
| 6,481,945 B1 | 11/2002 | Hasper et al. |
| 6,482,262 B1 | 11/2002 | Elers et al. |
| 6,482,733 B2 | 11/2002 | Raaijmakers et al. |
| 6,482,740 B2 | 11/2002 | Soininen et al. |
| 6,492,283 B2 | 12/2002 | Raaijmakers et al. |
| 6,511,539 B1 | 1/2003 | Raaijmakers |
| 6,551,406 B2 | 4/2003 | Kilpi |
| 6,572,705 B1 | 6/2003 | Suntola et al. |
| 6,578,287 B2 | 6/2003 | Aswad |
| 6,579,372 B2 | 6/2003 | Park |
| 6,593,484 B2 | 7/2003 | Yasuhara et al. |
| 6,630,030 B1 | 10/2003 | Suntola et al. |
| 6,630,201 B2 | 10/2003 | Chiang et al. |
| 6,660,126 B2 | 12/2003 | Nguyen et al. |
| 6,716,287 B1 | 4/2004 | Santiago et al. |
| 6,718,126 B2 | 4/2004 | Lei |
| 6,734,020 B2 | 5/2004 | Lu et al. |
| 6,772,072 B2 | 8/2004 | Ganguli et al. |
| 6,773,507 B2 | 8/2004 | Jallepally et al. |
| 6,777,352 B2 | 8/2004 | Tepman et al. |
| 6,778,762 B1 | 8/2004 | Shareef et al. |
| 6,815,285 B2 | 11/2004 | Choi et al. |
| 6,818,094 B2 | 11/2004 | Yudovsky |
| 6,821,563 B2 | 11/2004 | Yudovsky |
| 6,866,746 B2 | 3/2005 | Lei et al. |
| 6,868,859 B2 | 3/2005 | Yudovsky |
| 2001/0000866 A1 | 5/2001 | Sneh et al. |
| 2001/0002280 A1 | 5/2001 | Sneh |
| 2001/0008115 A1 | 7/2001 | Kawase et al. |
| 2001/0009140 A1 | 7/2001 | Bondestan et al. |
| 2001/0009695 A1 | 7/2001 | Saanita et al. |
| 2001/0011526 A1 | 8/2001 | Doering et al. |
| 2001/0013312 A1 | 8/2001 | Soninen et al. |
| 2001/0014371 A1 | 8/2001 | Kilpi |
| 2001/0024387 A1 | 9/2001 | Raaijmakers et al. |
| 2001/0025979 A1 | 10/2001 | Kim et al. |
| 2001/0028924 A1 | 10/2001 | Sherman |
| 2001/0034123 A1 | 10/2001 | Jeon et al. |
| 2001/0041250 A1 | 11/2001 | Werkhoven et al. |
| 2001/0042523 A1 | 11/2001 | Kesala |
| 2001/0042799 A1 | 11/2001 | Kim et al. |
| 2001/0048973 A1 | 12/2001 | Sato et al. |
| 2001/0050039 A1 | 12/2001 | Park |

| | | |
|---|---|---|
| 2001/0054377 A1 | 12/2001 | Lindfors et al. |
| 2001/0054730 A1 | 12/2001 | Kim et al. |
| 2001/0054769 A1 | 12/2001 | Raajimakers et al. |
| 2002/0000196 A1 | 1/2002 | Park |
| 2002/0000598 A1 | 1/2002 | Kang et al. |
| 2002/0001974 A1 | 1/2002 | Chan |
| 2002/0007790 A1 | 1/2002 | Park |
| 2002/0009544 A1 | 1/2002 | McFeely et al. |
| 2002/0015790 A1 | 2/2002 | Baum et al. |
| 2002/0020869 A1 | 2/2002 | Park et al. |
| 2002/0021544 A1 | 2/2002 | Cho et al. |
| 2002/0025979 A1 | 2/2002 | Kunz et al. |
| 2002/0031618 A1 | 3/2002 | Sherman |
| 2002/0033229 A1 | 3/2002 | Lebouitz et al. |
| 2002/0034123 A1 | 3/2002 | Fuengeld |
| 2002/0041931 A1 | 4/2002 | Suntola et al. |
| 2002/0042165 A1 | 4/2002 | Putkonen |
| 2002/0047151 A1 | 4/2002 | Kim et al. |
| 2002/0048635 A1 | 4/2002 | Kim et al. |
| 2002/0052097 A1 | 5/2002 | Park |
| 2002/0054769 A1 | 5/2002 | Nakamura |
| 2002/0066411 A1 | 6/2002 | Chiang et al. |
| 2002/0068458 A1 | 6/2002 | Chiang et al. |
| 2002/0073924 A1 | 6/2002 | Chiang et al. |
| 2002/0076481 A1 | 6/2002 | Chiang et al. |
| 2002/0076507 A1 | 6/2002 | Chiang et al. |
| 2002/0076508 A1 | 6/2002 | Chiang et al. |
| 2002/0076837 A1 | 6/2002 | Hujanen et al. |
| 2002/0081844 A1 | 6/2002 | Jeon et al. |
| 2002/0082296 A1 | 6/2002 | Verschoor et al. |
| 2002/0086106 A1 | 7/2002 | Park et al. |
| 2002/0092471 A1 | 7/2002 | Kang et al. |
| 2002/0094689 A1 | 7/2002 | Park |
| 2002/0098627 A1 | 7/2002 | Pomarede et al. |
| 2002/0104481 A1 | 8/2002 | Chiang et al. |
| 2002/0106451 A1 | 8/2002 | Skarp et al. |
| 2002/0106536 A1 | 8/2002 | Lee et al. |
| 2002/0108570 A1 | 8/2002 | Lindfors et al. |
| 2002/0115252 A1 | 8/2002 | Haukka et al. |
| 2002/0115886 A1 | 8/2002 | Yasuhara et al. |
| 2002/0121241 A1 | 9/2002 | Nguyen et al. |
| 2002/0121342 A1 | 9/2002 | Lu et al. |
| 2002/0127745 A1 | 9/2002 | Lu et al. |
| 2002/0134307 A1 | 9/2002 | Choi |
| 2002/0144655 A1 | 10/2002 | Chiang et al. |
| 2002/0144657 A1 | 10/2002 | Chiang et al. |
| 2002/0146511 A1 | 10/2002 | Chiang et al. |
| 2002/0146895 A1 | 10/2002 | Ramdani et al. |
| 2002/0153579 A1 | 10/2002 | Yamamoto |
| 2002/0155722 A1 | 10/2002 | Satta et al. |
| 2002/0162506 A1 | 11/2002 | Sneh et al. |
| 2002/0164421 A1 | 11/2002 | Chiang et al. |
| 2002/0164423 A1 | 11/2002 | Chiang et al. |
| 2002/0177282 A1 | 11/2002 | Song |
| 2002/0182320 A1 | 12/2002 | Leskela et al. |
| 2002/0187256 A1 | 12/2002 | Elers et al. |
| 2002/0187631 A1 | 12/2002 | Kim et al. |
| 2002/0196591 A1 | 12/2002 | Hujanen et al. |
| 2002/0197402 A1 | 12/2002 | Chiang et al. |
| 2002/0197831 A1 | 12/2002 | Todd et al. |
| 2003/0004723 A1 | 1/2003 | Chihara |
| 2003/0010451 A1 | 1/2003 | Tzu et al. |
| 2003/0013320 A1 | 1/2003 | Kim et al. |
| 2003/0017697 A1 | 1/2003 | Choi et al. |
| 2003/0022338 A1 | 1/2003 | Ruben et al. |
| 2003/0031807 A1 | 2/2003 | Elers et al. |
| 2003/0042630 A1 | 3/2003 | Babcoke et al. |
| 2003/0049942 A1 | 3/2003 | Haukka et al. |
| 2003/0053799 A1 | 3/2003 | Lei et al. |
| 2003/0057527 A1 | 3/2003 | Chung et al. |
| 2003/0072913 A1 | 4/2003 | Chou et al. |
| 2003/0072975 A1 | 4/2003 | Shero et al. |
| 2003/0075273 A1 | 4/2003 | Kilpela et al. |
| 2003/0075925 A1 | 4/2003 | Lindfors et al. |
| 2003/0079686 A1 | 5/2003 | Chen et al. |
| 2003/0082296 A1 | 5/2003 | Elers et al. |
| 2003/0089308 A1 | 5/2003 | Raaijmakers |
| 2003/0101927 A1 | 6/2003 | Raajimakers |
| 2003/0101938 A1 | 6/2003 | Ronsee et al. |
| 2003/0106490 A1 | 6/2003 | Jallepally et al. |
| 2003/0113187 A1 | 6/2003 | Lei et al. |
| 2003/0116087 A1 | 6/2003 | Nguyen et al. |
| 2003/0121469 A1 | 7/2003 | Lindfors et al. |
| 2003/0121608 A1 | 7/2003 | Chen et al. |
| 2003/0140854 A1 | 7/2003 | Kilpi |
| 2003/0143328 A1 | 7/2003 | Chen et al. |
| 2003/0143747 A1 | 7/2003 | Bondestam et al. |
| 2003/0153177 A1 | 8/2003 | Tepman et al. |
| 2003/0172872 A1 | 9/2003 | Thakur et al. |
| 2003/0194493 A1 | 10/2003 | Chang et al. |
| 2003/0198754 A1 | 10/2003 | Xi et al. |
| 2003/0213560 A1 | 11/2003 | Wang et al. |
| 2003/0216981 A1 | 11/2003 | Tillman |
| 2003/0219942 A1 | 11/2003 | Choi et al. |
| 2003/0221780 A1 | 12/2003 | Lei et al. |
| 2003/0224107 A1 | 12/2003 | Lindfors et al. |
| 2004/0005749 A1 | 1/2004 | Choi et al. |
| 2004/0011404 A1 | 1/2004 | Ku et al. |
| 2004/0011504 A1 | 1/2004 | Ku et al. |
| 2004/0013577 A1 | 1/2004 | Ganguli et al. |
| 2004/0014320 A1 | 1/2004 | Chen et al. |
| 2004/0015300 A1 | 1/2004 | Ganguli et al. |
| 2004/0016404 A1 | 1/2004 | Gregg et al. |
| 2004/0025370 A1 | 2/2004 | Guenther et al. |
| 2004/0065255 A1 | 4/2004 | Yang et al. |
| 2004/0069227 A1 | 4/2004 | Ku et al. |
| 2004/0071897 A1 | 4/2004 | Verplancken et al. |
| 2004/0144308 A1 | 7/2004 | Yudovsky |
| 2004/0144311 A1 | 7/2004 | Chen et al. |
| 2004/0219784 A1 | 11/2004 | Kang et al. |
| 2004/0224506 A1 | 11/2004 | Choi et al. |
| 2004/0235285 A1 | 11/2004 | Kang et al. |
| 2005/0006799 A1 | 1/2005 | Gregg et al. |
| 2005/0059240 A1 | 3/2005 | Choi et al. |
| 2005/0095859 A1 | 5/2005 | Chen et al. |
| 2005/0104142 A1 | 5/2005 | Narayanan et al. |

FOREIGN PATENT DOCUMENTS

| | | |
|---|---|---|
| GB | 2 355 727 | 5/2001 |
| JP | 58-098917 | 6/1983 |
| JP | 60-070176 | 4/1985 |
| JP | 01265511 | 10/1989 |
| JP | 04-291916 | 10/1992 |
| JP | 05-047666 | 2/1993 |
| JP | 05-206036 | 8/1993 |
| JP | 05-234899 | 9/1993 |
| JP | 05-270997 | 10/1993 |
| JP | 06-224138 | 8/1994 |
| JP | 2000212752 | 8/2000 |
| JP | 2000319772 | 11/2000 |
| JP | 2001020075 | 1/2001 |
| JP | 2001111000 | 4/2001 |
| JP | 2001172767 | 6/2001 |
| WO | WO 96/17107 | 6/1996 |
| WO | WO 99/01595 | 1/1999 |
| WO | WO 99/29924 | 6/1999 |
| WO | WO 99/65064 | 12/1999 |
| WO | WO 00/15865 | 3/2000 |
| WO | WO 00/16377 | 3/2000 |
| WO | WO 00/54320 | 9/2000 |
| WO | WO 00/79576 | 12/2000 |
| WO | WO 01/15220 | 3/2001 |
| WO | WO 01/17692 | 3/2001 |
| WO | WO 01/27346 | 4/2001 |
| WO | WO 01/27347 | 4/2001 |

| | | |
|---|---|---|
| WO | WO 01/29280 | 4/2001 |
| WO | WO 01/29891 | 4/2001 |
| WO | WO 01/29893 | 4/2001 |
| WO | WO 01/36702 | 5/2001 |
| WO | WO 01/40541 | 6/2001 |
| WO | WO 01/66832 | 9/2001 |
| WO | WO 01/82390 | 11/2001 |
| WO | WO 01/88972 | 11/2001 |
| WO | WO 02/08485 | 1/2002 |
| WO | WO 02/08488 | 1/2002 |
| WO | WO 02/09167 | 1/2002 |
| WO | WO 02/31875 | 4/2002 |
| WO | WO 02/43115 | 5/2002 |
| WO | WO 02/45167 | 6/2002 |
| WO | WO 02/45871 | 6/2002 |
| WO | WO 02/67319 | 8/2002 |
| WO | WO 03/23835 | 3/2003 |

OTHER PUBLICATIONS

Bedair, et al. "Atomic layer epitaxy deposition process," J. Vac. Sci. Technol. B. 12(1), 179, Jan./Feb. 1994.

Clark-Phelps, et al. "Engineered Tantalum Aluminate and Hafnium Aluminate ALD Films for Ultrathin Dielectric Films with Improved Electrical and Thermal Properties," Mat. Res. Soc. Symp. Proc. vol. 670, 2001.

Eisenbraum, et al. "Atomic Layer Deposition (ALD) of Tantalum-based materials for zero thickness copper barrier applications," Proceedings of the IEEE 2001 International Interconnect Technology Conference (Cat. No. 01EX461) 2001.

Hummel, et al. "Abstract of Characteristics of GaAs, AlGaAs, and InGaAs Materials Grown by Metalorganic Chemical Vapor Deposition ing an On-Demand Hydride Gas Generator", Applied Physics Letter, vol. 60, No. 12, pp. 1483-1485, Mar. 23, 1992.

Imai, et al. "Atomic layer epitaxy of Si ing atomic H" Thin Solid Films 225, 168, 1993.

Kukli, et al. "Atomic Layer Epitaxy Growth of Tantalum Oxide Thin Films from $Ta(OC_2H_5)_5$ and $H_2O$," Journal of the Electrochemical Society, vol. 142, No. 5, May 1995; p. 1670-5.

Kukli, et al. "In situ Study of Atomic Layer Epitaxy Growth of Tantalum Oxide Thin Films From $Ta(OC_2H_5)_5$ and $H_2O$," Applied Surface Science, vol. 112, Mar. 1997, p. 236-42.

Kukli, et al. "Properties of $\{Nb_{1-x}Ta_x\}_2O_5$ Solid Solutions and $\{Nb_{1-x}Ta_x\}_2O_5$-$ZrO_2$ Nanolaminates Grown by Atomic Layer Epitaxy," 1997; p. 785-93.

Kukli, et al. "Properties of $Ta_2O_5$-Based Dielectric Nanolaminates Deposited by Atomic Layer Epitaxy," Journal of the Electrochemical Society, vol. 144, No. 1, Jan. 1997; p. 300-6.

Kukli, et al. "Tailoring the Dielectric Properties of $HfO_2$-$Ta_2$-$O_5$ Nanolaminates," Applied Physics Letters, vol. 68, No. 26, Jun. 24, 1996; p. 3737-9.

Ninisto, et al. "Synthesis of Oxide Thin Films and Overlayers by Atomic Layer Epitaxy for Advanced Applications," Materials Science and Engineering B41, 1996, pp. 23-29.

Ritala, et al. "Chemical Vapor Deposition," Jan. 1999, p. 6-9.

Rossnagel, et al. "Plasma-enhanced Atomic Layer Deposition of Ta and Ti for Interconnect Diffion Barriers," J. Vac. Sci. Technol. B., vol. 18, No. 4, Jul. 2000; pp. 2016-2020.

Yokoyama, et al. "Atomic-layer selective deposition of silicon nitride on hydrogen-terminated Si surfaces," Applied Surface Science 130-132 (1998) 352-356.

APPARATUS FOR PROVIDING GAS TO A PROCESSING CHAMBER

CROSS-REFERENCE TO RELATED APPLICATIONS

This application is a continuation of co-pending U.S. patent application Ser. No. 10/208,305, filed Jul. 29, 2002 now U.S. Pat. No. 6,915,592, which is herein incorporated by reference.

BACKGROUND OF THE INVENTION

1. Field of the Invention

Embodiments of the invention generally relate to a method and apparatus for subliming a solid to provide a gas to a micromachining processing chamber.

2. Description of the Related Art

Semiconductor processing and micromachining use a wide variety of process gases. As structures and devices become increasingly complex, it would be advantageous to provide greater variety of process chemistries. However, some processes gases may be prohibitively expensive to refine, difficult to handle or suffer from other shortcomings such as highly reliable gas delivery techniques.

Process gases used during semiconductor processing and micromachining are typically provided to the gas panel in liquid or gaseous form from a central source or a supply vessel positioned proximate the gas panel. Some process gases may be generated at or near the gas panel from solid material through a sublimation process. Sublimation is generally the process through which a gas is produced directly from a solid at a certain pressure and temperature without passing through a liquid state. Some gases that may be produced through a sublimation process include xenon difluoride and nickel carbonyl, among others. As these materials tend to be very reactive and expensive, careful control of the sublimation process is required in order to manage the generation of sublimed process gases without undue waste.

A conventional sublimation process is typically performed in a heated vessel loaded or filled with the solid material to be sublimed. As gas is needed, the vessel walls and or tray supporting the solid material are heated and gas is produced. However, this method has a number of drawbacks.

Primarily, it is difficult to control heat transfer through the walls of the vessel. This results in inefficient consumption of the sublimed solids. The sublimation reaction driven by the heated walls of the vessel consumes the outer portions of the solids contained in the vessel. As many sublimed gases have a propensity to coagulate with the generating solid upon cooling, the solid coagulates at the center of the vessel, substantially reducing the surface area available for future sublimation.

Additionally, the temperature gradient within the vessel results in difficulty controlling the volume of sublimed process gas produced. Once a desired amount of process gas has been produced, residual heat of the vessel walls continues to undesirably drive the sublimation reaction, thereby producing an excess of process gas. The production of more gas than necessary drives up process costs and additionally requires frequent process interruption to recharge the crystals within the vessel. The residual gas also may attack the components within the gas delivery system.

Moreover, some sublimed gases, such as xenon difluoride, have a propensity to deposit on passages of the vessel and subliming crystals. Thus, prevention of excess process gas generation/formation prevents clogging of vessel passages. Additionally, preventing the subliming crystals from coagulating with re-deposited material maintains the surface area available for future sublimation, thus improving the gas generation uniformity over a larger process window.

Therefore, a need exists for an improved method and apparatus for providing sublimed gases to a processing chamber.

SUMMARY OF THE INVENTION

In one aspect of the invention, an apparatus for generating gas for a processing system is provided. In one embodiment, an apparatus for generating gas for a processing system includes a unitary, isolatable, transportable canister having a plurality of first spacing elements, a plurality of second spacing elements and a solid material disposed within the canister. The spacing elements have different mean diameters. The solid material is adapted to produce a gas vapor when exposed to a temperature above a predetermined level at a predetermined pressure.

In another embodiment, an apparatus for generating gas for a processing system includes a gas source coupled to a processing chamber by a first gas line. A canister is coupled in-line with the first gas line and contains a solid material that produces a process gas when heated. A heater is disposed between the gas source and the canister to heat gas flowing into the canister.

In another aspect of the invention, a method for generating gas for a processing chamber is provided. In one embodiment, a method for generating gas for a processing chamber includes heating a carrier gas flowing in a first gas line, flowing the heated carrier gas into a canister containing a solid material and generating a process gas from the solid material by sublimation.

BRIEF DESCRIPTION OF THE DRAWINGS

A more particular description of the invention, briefly summarized above, may be had by reference to the embodiments thereof that are illustrated in the appended drawings. It is to be noted, however, that the appended drawings illustrate only typical embodiments of the inventions and are therefore not to be considered limiting of its scope, for the invention may admit to other equally effective embodiments.

To facilitate understanding, identical reference numerals have been used, wherever possible, to designate identical elements that are common to the figures.

DETAILED DESCRIPTION

Figure 1:
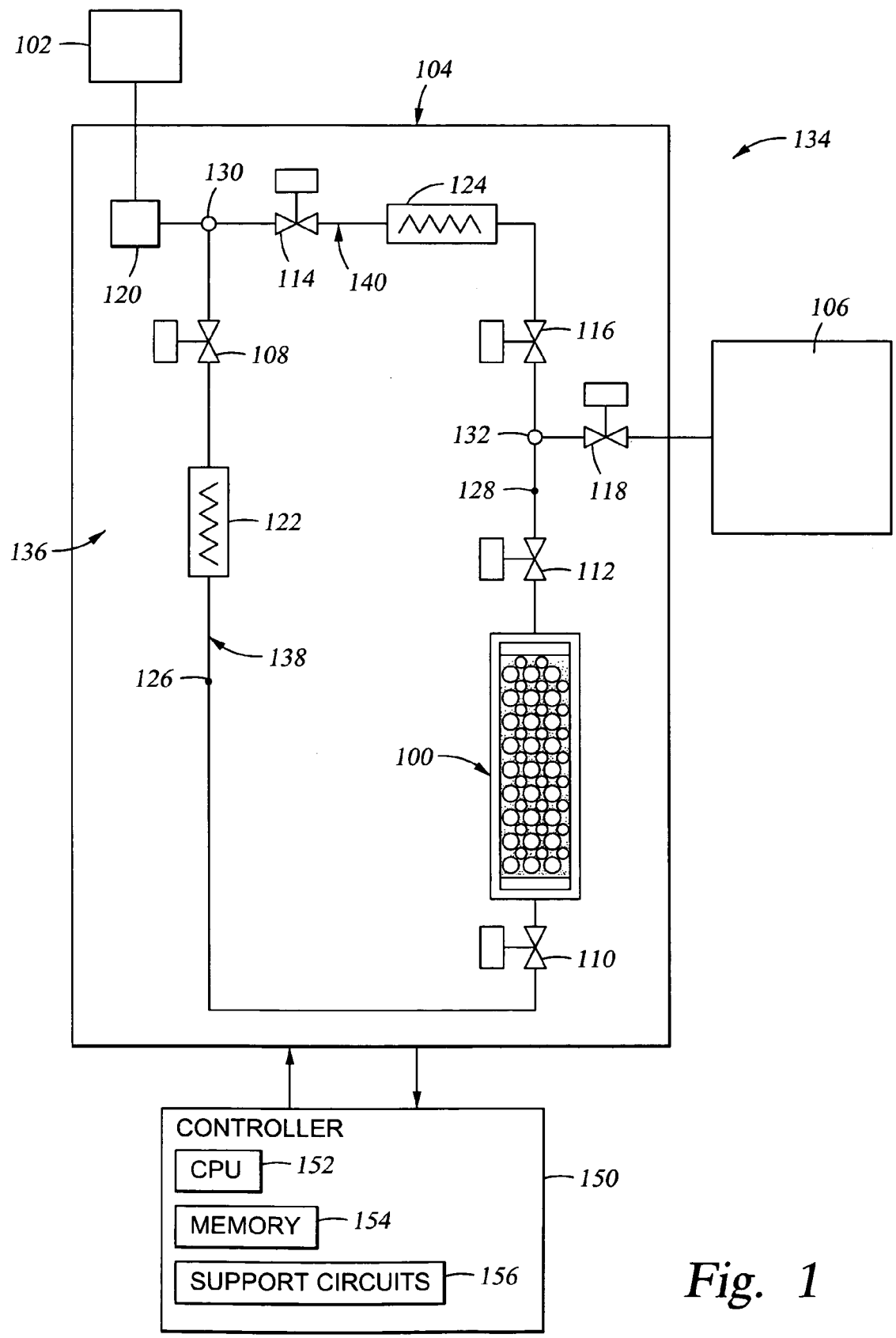
FIG. 1 is a simplified schematic view of a processing system having one embodiment of a gas generation system.

FIG. 1 generally depicts a simplified schematic of a processing system 134, which in one embodiment, is suitable for micromachining structures on silicon or other materials. The processing system 134 generally includes a processing chamber 106 coupled to a gas panel 104. The processing chamber may be any suitable processing chamber, for example, those available from Applied Materials, Inc. located in Santa Clara, Calif. Exemplary processing chambers include DPS CENTURA® etch chambers, PRODUCER® chemical vapor deposition chambers, DzX® chemical vapor deposition chambers and ENDURA® physical vapor deposition chambers, among others.

The gas panel 104 generally controls the rate and pressure at which various process and inert gases are delivered to the processing chamber. The number and types of process and other gases delivered to the processing chamber 106 are generally selected based on the process to be performed in the processing chamber 106 coupled thereto. For clarity, only a single gas delivery circuit 136 is depicted in the gas panel 104. However, multiple gas delivery circuits are contemplated.

The gas delivery circuit 136 is generally coupled between a carrier gas source 102 and the processing chamber 106. The carrier gas source 102 may be a local or remote vessel, or may be a centralized facility source that supplies the carrier gas throughout the facility. The carrier gas source 102 typically supplies a carrier gas such as argon, nitrogen, neon, helium or other inert or non-reactive gas.

The gas delivery circuit 136 typically includes a flow controller 120 disposed between the carrier gas source 102 and a first tee 130 that separates the gas delivery circuit 136 into a gas generation line 138 and a bypass line 140. A second tee 132 rejoins the gas generation line 138 and the bypass line 140 before connecting to the processing chamber 106. The flow controller 120 may be a proportional valve, modulating valve, needle valve, regulator, mass flow controller or the like. One flow controller 120 that may be utilized is available from Sierra Instruments, Inc., located in Monterey, Calif.

The gas generation line 138 generally includes a first heater 122 and a sublimation or source canister 100 coupled in series. A first valve 108 is coupled between a first heater 122 and the first tee 130. A first sensor 126 or other means for measuring temperature is coupled to the gas generation line 136 between the first heater 122 and a second valve 110. The first sensor 126 is adapted to detect a metric indicative of a temperature of the carrier gas flowing through the gas generation line 138 into the canister 100. In one embodiment, the first sensor 126 is a thermocouple disposed against a conduit comprising the gas generation line 138. One sensor 126 that may be utilized is available from Davis Instruments, Inc., located in Baltimore, Md.

The source canister 100 is coupled between the second valve 110 and a third valve 112. In one embodiment, the second and third valves 110, 112 are coupled to the gas generation line 138 by disconnect fittings (not shown) to facilitate removal of the valves 110, 112 and canister 100 from the gas generation line 138 as a unitary assembly.

The second tee 132 is coupled between the third valve 112 and the processing chamber 106. The second tee 132 couples the output of the source canister 100 the bypass line 140 to the processing chamber 106. A second sensor 128 or other means for measuring temperature is coupled to the gas generation line 138 between the third valve 112 and the second tee 132. The second sensor 128 is adapted to detect a metric indicative of a temperature of the gases flowing out of the canister 100.

The bypass line 140 generally includes a fourth valve 114 coupled between a second heater 124 and the first tee 130. A fifth valve 116 is coupled between the second heater 124 and the second tee 132. A sixth valve 118 is generally coupled between the second tee 132 and the processing chamber 106 to selectively isolate the processing chamber 106 from the gas delivery circuit 136.

The first through sixth valves 108, 110, 112, 114, 116, 118 are typically shut off valves used to divert the flow of gases within the gas delivery circuit 136. The valves may also be used to selectively isolate the various components within the gas delivery circuit 136 to facilitate removal, replacement and/or service of the isolated component. The second, third, fifth and sixth valves 110, 112, 116, 118 are fabricated from materials compatible with the process and other gases handled by the gas delivery circuit 136. In one embodiment, the valves 110, 112, 116 and 118 may have valve bodies fabricated from stainless steel or nickel alloys and utilized KEL-F® or CHEMREZ® seals. The first and fourth valves 108, 114 are fabricated from materials compatible with the carrier gas. Typically, the valves are actuated in response to a signal from a controller 150 to coordinate the delivery of gases through the gas delivery circuit 136. Valves that may be utilized are available from Parker-Hannifin Corp., located in Cleveland, OH.

The first and second heaters 122, 124 may be any heating elements adapted to heat a flow of gas traveling in the gas production and bypass lines 138, 140. In one example, the heaters 122, 124 may be a block of material disposed proximate, against or circumscribing the gas production and bypass lines 138, 140 and having a cartridge heater or a heat transfer fluid flowing therethrough. In another, the heater 122, 124 may be a surface heater disposed against or proximate the conduits comprising the lines 138, 140, and are commercially available from many sources, including from Watlow Electric Manufacturing Company, located in St. Louis, Mo. The heater 122, 124 and/or gas production and bypass lines 138, 140 may be optionally insulated.

Figure 2:
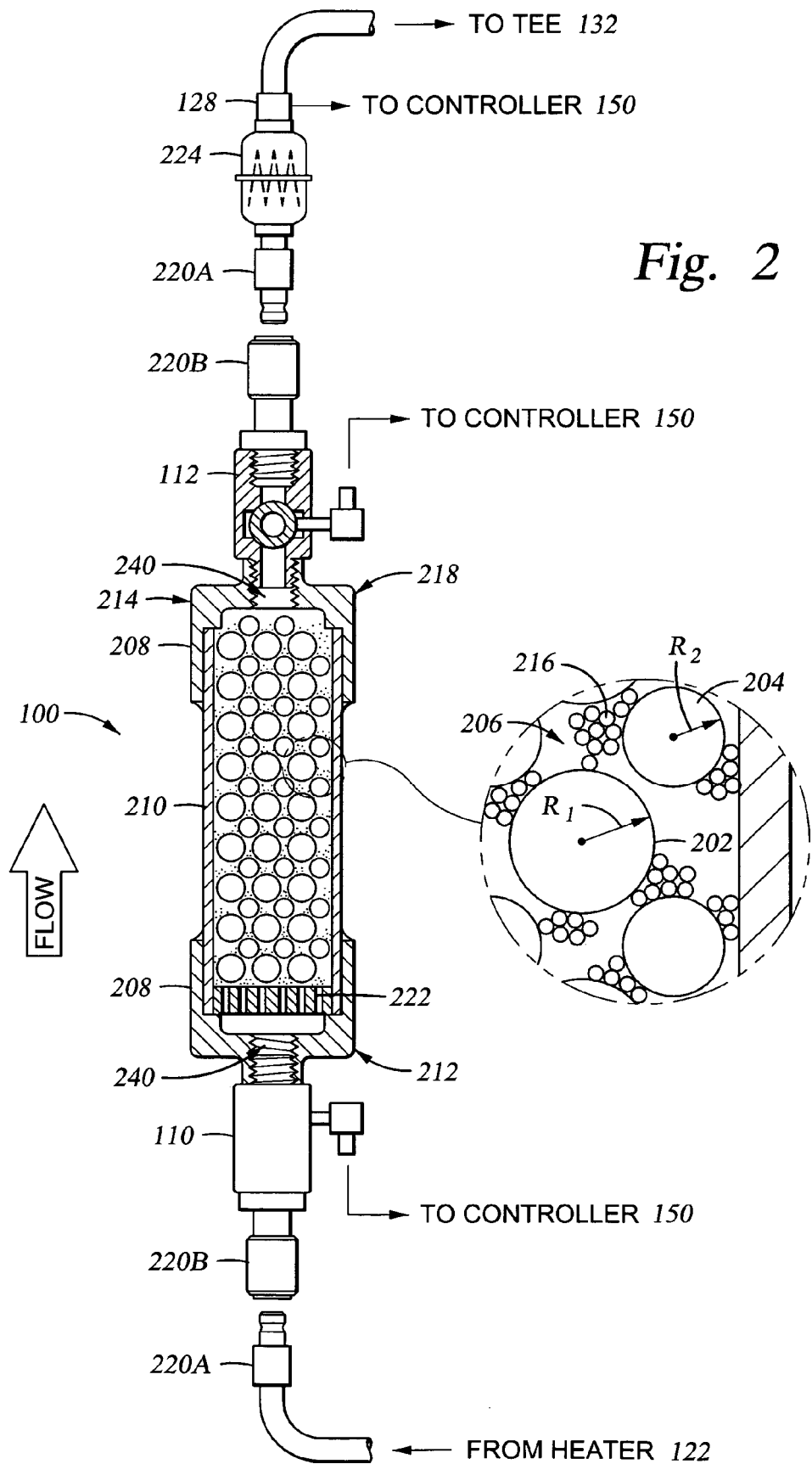
FIG. 2 is a sectional view of one embodiment of a sublimation canister.

FIG. 2 depicts a sectional view of the canister 100. The canister 100 generally includes a housing 218 that is adapted to hold precursor solids 216 from which a process (or other) gas may be generated through a sublimation process. The precursor solids 216 are typically any subliming solid with a non-linear vapor release curve. The precursor solids 216 with linear vapor release curves may also be used but have subliming reactions that are difficult to control. Some precursor solids 216 that may be utilized generate process gas in the canister 100 through a sublimation process include xenon difluoride, nickel carbonyl, pentakis(dimethylamino) tantalum (PDMAT) and tungsten hexacarbonyl, among others. The precursor solids 216 are typically in granular or powered form.

The housing 218 is generally fabricated from a material substantially inert to the solids 216 and gas produced therefrom, and thus, the material of construction may vary based on gas being produced. In one embodiment, xenon difluoride is generated within the canister 100 and the housing 218 is fabricated from a material substantially inert to xenon difluoride, for example, stainless steel, aluminum, nickel, fluoropolymers, PTFE, PFA or other, suitable non-organic material.

The housing 218 may have any number of geometric forms and may provide either a direct or labyrinth flow path for gases passing therethrough. In the embodiment depicted in FIG. 2, the housing 218 comprises a hollow body 210 that is generally packed with the plurality of first spacing elements 202 and the plurality of second spacing elements 204. The body 210 has a first end 212 and a second end 214 respectively sealed by end caps 208. The end caps 208 may be coupled to the body 210 by welding, bonding, adhesives or other leak-tight method. Alternatively, the body 210 and the end cap 208 joint may have a seal, o-ring or gasket disposed therebetween to prevent leakage from the canister 100. The hollow body 210 may be a cylinder or alternatively comprise other hollow geometric forms, such as hollow square tubes, hexagonal tubes, regular and irregular polygonal tubes, and oval tubes, among other shapes.

Each end cap 208 includes a port 240 to allow gas flow into and out of the canister 100. The port 240 is generally sealable to allow the interior of the canister 100 to be isolated from the surrounding environment during removal of the canister 100 from the gas delivery circuit 136. In one embodiment, the second and third valves 110, 112 are sealingly coupled to each port 240 to prevent leakage from the canister 100 when removed from the gas generation line 138. Mating disconnect fittings 220A, 220B may be coupled to the valves 110, 112 to facilitate removal and replacement of the canister 100 to the gas generation line 138. The third valve 112 is typically a ball valve or other positive sealing valve that has an orifice sufficient to allow the canister 100 to be charged with the solids 116 therethrough without removal of the end caps 208. The canister 100 is typically agitated to allow the solids 216 to intersperse between the spacing elements 202, 204. This allows the canister 100 to be efficiently loaded and recycled while minimizing potential solid 216 or gas leakage from the canister 100 during filling, transport or coupling to the gas delivery circuit 136. In one embodiment, the third valve 112 has a ½ inch orifice.

A first filter 222 is disposed inside the canister 100 proximate a first end 212 to prevent the solids 216 from passing out of the first end 212 of the canister 100. A second filter 224 is coupled between the third valve 112 and the second tee 132 to prevent solids 216 from entering the processing system 106. The second filter 224 typically remains coupled to the gas delivery circuit 138 when the canister 100 is removed for replacement or refilling.

The filters 222, 224 are generally inert to the reactive solids 216 and gas subliming therefrom. The filters 222, 224 provide a resistance of flow that enhances flow uniformity of gas through the canister 100. The filters 222, 224 additionally prevent the solids 216 from escaping the canister 100. In one embodiment, the filters 222, 224 may be fabricated from fluoropolymers, PFA, PTFE, porous nickel and the like.

The plurality of first spacing elements 202 and the plurality of second spacing elements 204 filling the canister 100 have at least one different physical attribute, typically a difference in mean diameter or shape that allows the first spacing elements 202 and the second spacing elements 204 to define an interstitial space 206 therebetween. The interstitial space 206 provides a volume in which the reactive solid 216 partially fills, while the remaining interstitial space 206 is allocated for the flow of gas through the canister 100.

The first spacing elements 202 and the second spacing elements 204 may have any wide variety of shapes to provide spacing for the precursor solids 216. For examples, the spacing elements 202, 204 may be spherical, cylindrical, conical, ellipsoidal, regular or irregular polyhedrons, or other shapes or a combination thereof, and are configured with different mean diameters to provide a predetermined packing density within the interstitial space 206. The surface of the spacing elements 202, 204 may be smooth, roughened or patterned. Spacing elements 202, 204 that include a roughened surface have a greater surface area available for sublimed gases to condense upon. Thus, as the spacing elements 202, 204 become coated with condensed reactive solids 216, a large expose surface area of reactive solids 216 is maintained to maximize the amount of reactive solids 216 available for future subsequent reactions. One embodiment may have spacing elements 202, 204 having the same shape but of different sizes, as well as different shapes of spacing elements 202, 204 in a variety of sizes, selected depending upon a number of parameters such as source solid characteristics, density, porosity, composition of the spacing elements, internal volume and shape of the canister, and the amount of process gas to be generated.

The material of the spacing elements 202, 204 is preferably one with low thermal conductivity and low heat capacity and allows for preferential re-deposition of the subliming solid 216 as compared to the other surfaces of the canister 100. Even with re-deposition, the arrangement of spacing elements 202, 204 maintains a large sublimation surface area required for consistent long-term use and uniform generation of sublimed gas from the solids 216. In one embodiment, the spacing elements 202, 204 are fabricated from stainless steel, aluminum, nickel, fluoropolymer, PTFE, PFA, ceramic, silicon carbide or other, suitable non-organic material. Alternatively, the spacing elements 202, 204 may be coated with a stainless steel, aluminum, nickel, fluoropolymer, PTFE, PFA, ceramic, silicon carbide or other, suitable non-organic material over a different core material. The size of the spacing elements 202, 204 are typically selected in relation to the crystal size of the source material 216.

In an embodiment adapted to sublime xenon difluoride, the first spacing elements 202 and the second spacing elements 204 are spheres and have a relationship that can be expressed by:

$$0.8 < R_2/R_1 < 0.95$$

where:

$R_1$ is a mean diameter of the first spacing element 202; and $R_2$ is a mean diameter of the second spacing element 204.

This relationship defines a predetermined packing density that advantageously provides sufficient surface area for uniform xenon difluoride sublimation using about 200 sccm of carrier gas at a temperature of at least about 20° C. In this configuration, there are large spaces between point contacts of the spacing elements 202, 204 that provide adequate volume for the subliming solid 216 to fill and a dispersed gas pass that ensures consistent sublimation. The spacing elements 202, 204 additionally present a large surface area for excess sublimed vapor to condense upon cooling, thus keeping a large surface area of precursor solids 216 consistently available for sublimation while preventing the coagulation of the entire subliming mass.

Figure 3:
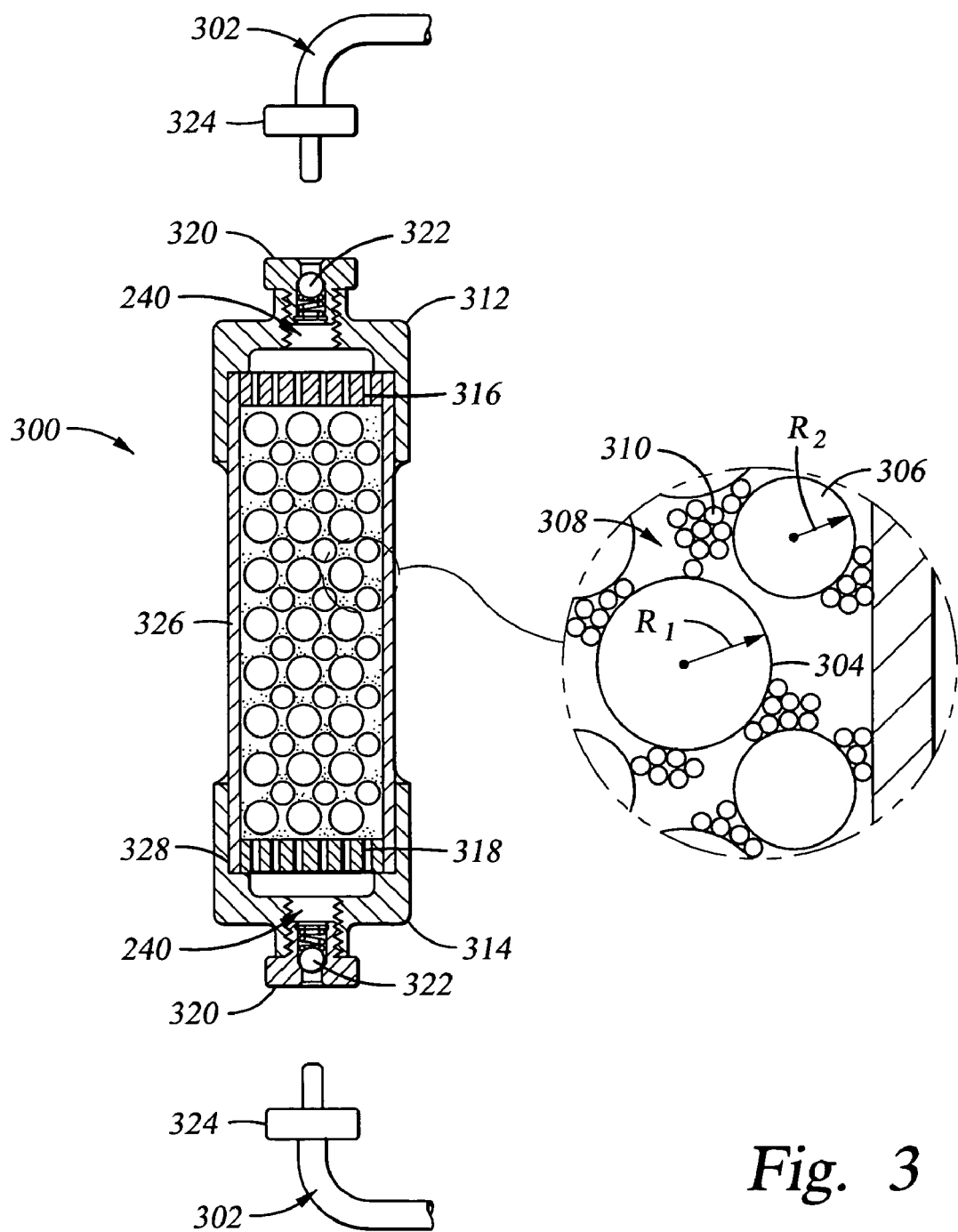
FIG. 3 is a sectional view of another embodiment of a sublimation canister.

FIG. 3 depicts another embodiment of a sublimation canister 300. The canister 300 is fabricated from a material compatible with the process chemistries. The canister 300 is packed with a plurality of first spacing elements 304 and a plurality of second spacing elements 306 defining an interstitial space 308 therebetween, in which sublimating precursor solids 310 are disposed. A first filter 316 and a second filter 318 are disposed within the canister 300 to contain the solids 310.

The canister 300 has a first end cap 312 and a second end cap 314. A gas-tight fitting 320 is typically coupled to each end cap 312, 314 and is adapted to allow disconnection of the canister 300 from a fluid line 302 while preventing leakage from the canister 300. In one embodiment, the fitting 320 includes an internal check valve 322 that prevents gas passage from the canister 300 until coupled with a mating fitting 324 of the fluid line 302.

The first end cap 312 is typically sealingly fastened to the canister 300 in a permanent manner. The second end cap 314 is removably coupled to the canister 300 to facilitate filling and/or refilling of the canister 300. With the second end cap 314 removed, the canister 300 may be emptied of the old spacers along with any unused solids 310 and refilled with new spacers and fresh solids 310, either as a pre-made mixture, or mixed as poured into the canister 300.

In one embodiment, the second end cap 314 is threaded to a body 326 of the canister 300. A seal, for example, an o-ring 328, is disposed between the second end cap 314 and body 326 to prevent leakage from the canister 300 after the second end cap 314 is coupled to the canister 300. The second filter 318 is typically removable from the canister 300 to facilitate filling the canister 300 with solids 310.

Referring back to FIG. 1, the controller 150 is coupled to the gas panel 104 and process chamber 106 to control the generation and delivery of gas delivery, and processing of substrates (not shown) within the process chamber 106. In one embodiment, the controller 150 includes a central processing unit (CPU) 152, memory 154 and support circuits 156. The CPU 152 may be one of any form of computer processor that can be used in an industrial setting for controlling various chambers and subprocessors. The memory 154 is coupled to the CPU 152. The memory 154, or computer-readable medium, may be one or more of readily available memory such as random access memory (RAM), read only memory (ROM), floppy disk, hard disk, or any other form of digital storage, local or remote. The support circuits 156 are coupled to the CPU 152 for supporting the processor in a conventional manner. These circuits include cache, power supplies, clock circuits, input/output circuitry, subsystems, and the like.

A process, for example, a gas generation process 400 described below, is generally stored in the memory 154, typically as a software routine. The software routine may also be stored and/or executed by a second CPU (not shown) that is remotely located from the hardware being controlled by the CPU 152.

Although the process of the present invention is discussed as being implemented as a software routine, some of the method steps that are disclosed therein may be performed in hardware as well as by the software controller. As such, the invention may be implemented in software as executed upon a computer system, in hardware as an application specific integrated circuit or other type of hardware implementation, or a combination of software and hardware.

Figure 4:
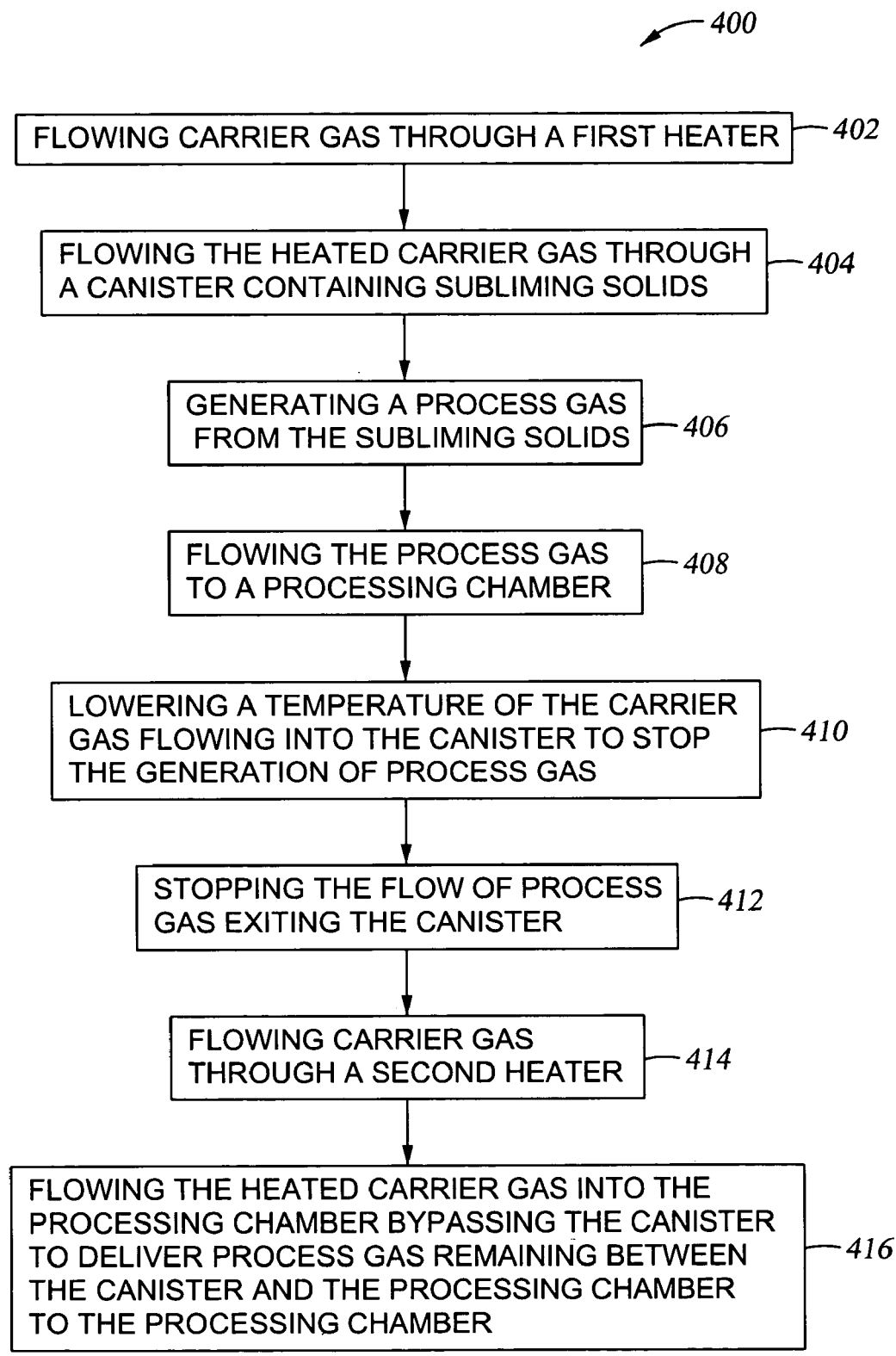
FIG. 4 is a flow diagram of one embodiment of a sublimation process.

FIG. 4 depicts a flow diagram of one embodiment of a method 400 for supplying gas to a processing chamber. One skilled in the art will appreciate that while one embodiment of the method 400 below describes xenon difluoride gas generation, other gases may be produced using the present invention such as pentakis(dimethylamino) tantalum, nickel carbonyl and tungsten hexacarbonyl, among others.

The method 400 begins at step 402 by flowing a carrier gas through the gas delivery line 138 through the first heater 122. The temperature of the carrier gas is typically at, or slightly below room temperature when leaving the gas source 102. The flow controller 120 generally controls the rate at which the carrier gas is provided through the gas delivery circuit 136. The fourth valve 114 disposed at the entrance of the bypass line 140 is closed to ensure that all gas flowing through the gas delivery circuit 136 travels through the gas delivery line 138.

The heater 122 generally heats the carrier gas flowing through the gas delivery line 138 to a predetermined temperature. In an embodiment that produces xenon difluoride gas, the heater 122 heats the carrier gas to about a temperature above about 20° C. For other subliming solids, the temperature may be selected utilizing a vaporization curve for a given pressure. The temperature of the gas leaving the first heater 122 is monitored by the first sensor 126. The first sensor 126 is coupled to the controller 150 to provide feedback to the heater 122 for accurate control of the carrier gas temperature. In one embodiment, the carrier gas is argon and provided at a rate of about 200 sccm and heated to greater than about 20° C.

At step 404, the heated carrier gas is flowed through the canister 100 containing the subliming solids 216. The predetermined heat of the carrier gas drives a sublimation reaction, causing a process gas to vaporize directly from the subliming solids 216 at step 406. In one embodiment, xenon difluoride is produced. However, the process may be utilized with other gases that are readily sublimed from solid form.

At step 408, the process gas generated in the canister 100 flows through the third valve 112 to the tee 132 and into the processing chamber 106. The fifth valve 116 is typically closed to prevent process gas from entering the bypass line 140. Alternatively, the fifth valve 116 may be at least partially opened to dilute the flow of gases exiting the canister 100.

Once a predetermined volume of process gas has been generated for delivery to the processing chamber 106, the first heater 122 is turned off to reduce the temperature of the carrier gas flowing into the canister 100. As the temperature of the carrier gas flowing into the canister is reduced, the sublimation reaction is stopped at step 410 thereby preventing excess process gas from being generated.

At step 412, the flow of process and/or carrier gas exiting the canister 100 is stopped. Typically, the third valve 112 is closed in response to the temperature of the gases leaving the canister 100 falling below a predefined temperature. Typically, this temperature is set at a point that prevents condensation of the process gas outside of the canister 100. Advantageously, the excess process gas remaining in the canister 100 condenses on the spacing elements 202, 204 thus maintaining a large surface area of precursor solids 216 available for the next sublimation reaction.

At step 414, the flow of carrier gas is diverted from the gas generation line 138 to the bypass line 140 by closing the first valve 108 and opening the fourth valve 114. The second heater 124 heats the carrier gas passing through the bypass line 140. Alternatively as described above, a portion of the carrier gas may be diverted through the bypass line 140 and mix this the gases exiting the canister 100 to control a dilution of the ratio of carrier to process gas that is delivered to the processing chamber 106. At step 416, the heated carrier gas flowing from the bypass line 140 delivers the remaining process gas between the canister 100 and the processing chamber 106 into the processing chamber 106 while avoiding condensation of the process gas within the gas delivery circuit 136.

Figure 5:
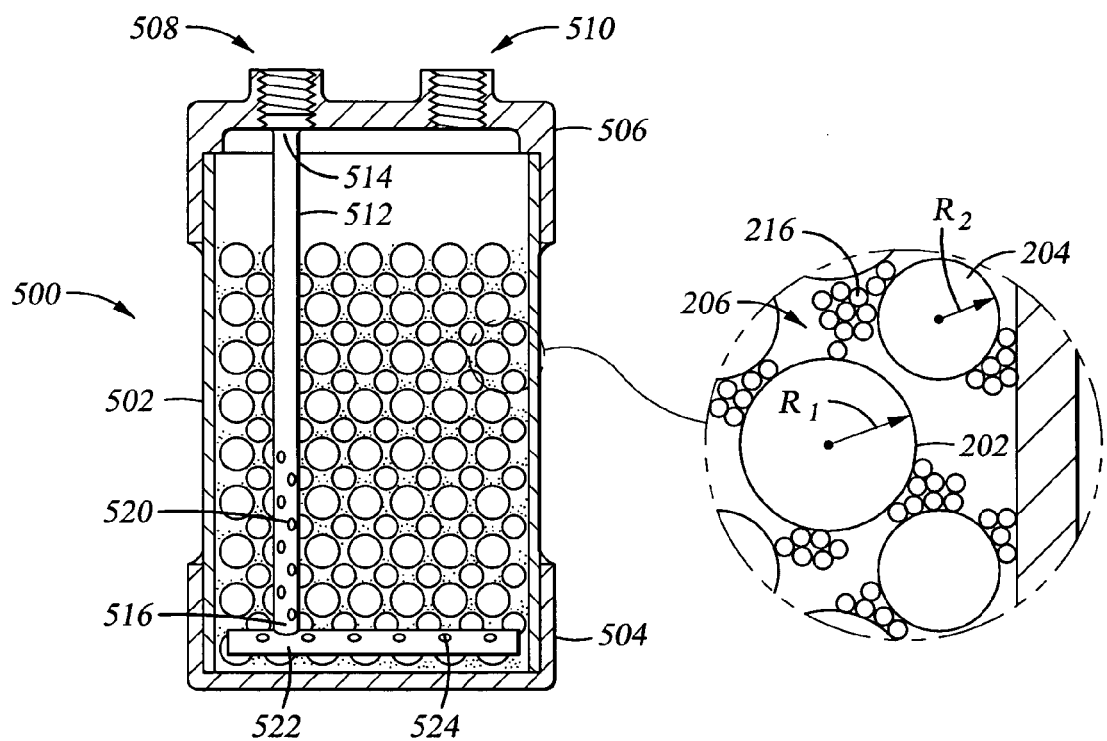
FIG. 5 is another embodiment of a sublimation canister.

Another embodiment of a sublimation canister 500 is depicted in FIG. 5 that may be utilized in the processing system 134 of FIG. 1. In this embodiment, the canister 500 is an ampoule having a body 502, a bottom 504, and an end cap 506. The body 502 and the bottom 504 may be comprised of a single piece of material or they may be separate components welded or otherwise sealingly fastened together. End cap 506 may be threaded and removable from body 502 as described in FIG. 3, or it may be sealingly fastened to the body 502 as described in FIG. 2. End cap 506 also contains a first port 508 and a second port 510 to allow for the flow of a gas into and out of canister 500.

The canister 500 is packed with a plurality of first spacing elements 202 and a plurality of second spacing elements 204 defining an interstitial space 206 therebetween, in which sublimating solids 216 are disposed. Canister 500 can be filled or re-filled with sublimating solids 216 by removing the end cap 506 or through port 510, if end cap 506 is sealingly fastened to canister body 502. Optionally, a filter (not shown) may be disposed within the canister 500 to contain the solids 216 as described in FIG. 3, or supplied outside the canister 500 as described in FIG. 2, to prevent any solids 216 or particles generated therefrom from entering the processing system 106.

In one embodiment, a tube 512 having a first end 514 and a second end 516 is disposed within the canister 500. The tube 512 is coupled at the first end 514 to the first port 508 and is of such a length that the second end 516 of the tube 512 is disposed among the spacing elements 202, 204.

Optionally, the second end 516 of the tube 512 may be adapted to diffuse the carrier gas flowing out of the tube 512 into the canister 500. The second end 516 may include a plurality of holes 520 formed therethrough to allow the carrier gas to flow into the canister 500 over a wide area. Alternatively or in addition to the holes 520, a diffuser plate 522 may be coupled to the second end 514 of the tube 512. The diffuser plate 522 includes a plurality of apertures 524 adapted to spread the carrier gas along the bottom of the canister 500 thereby driving the sublimation reaction over a larger area of the canister 500 for consistent gas sublimation and efficient consumption of precursor solids 216.

Therefore, a method and apparatus for generating a process gas via a sublimation process for a semiconductor processing chamber is provided. It is to be appreciated that the sublimation and delivery methods of the present invention may be used in semiconductor, micromachining, MEMS, optics and other processing chambers that would benefit from reliable generation of process gas or gases using the sublimation methods and advantageous apparatus described herein. A thermally controlled carrier gas is used to drive a subliming reaction that produces a processing gas. The rapid response of the subliming reaction to the temperature of the carrier gas allows for rapid production and stoppage of processing gas production, providing subliming material conservation and faster system response times. Moreover, a canister that holds the subliming material is modular and isolatable, thus facilitating rapid replacement during use to limit system downtime while providing a transportable vessel that may be recharged with new subliming material for future use.

While the foregoing is directed to the preferred embodiment of the present invention, other and further embodiments of the invention may be devised without departing from the basic scope thereof. The scope of the invention is determined by the claims that follow.

The invention claimed is:

1. An apparatus for generating gas within a process system, comprising:
   a modular, isolatable, transportable canister adapted for use in a gas panel of a delivery system connected to a process chamber; and
   a plurality of metallic elements and a solid precursor material contained within the canister, wherein the solid precursor material is in contact with the metallic elements.

2. The apparatus of claim 1, wherein the solid precursor material comprises an element selected from the group consisting of tantalum, tungsten, nickel and fluorine.

3. The apparatus of claim 2, wherein the solid precursor material comprises pentakis(dimethylamino) tantalum.

4. The apparatus of claim 1, wherein the metallic elements comprise a metal selected from the group consisting of stainless steel, aluminum, nickel, alloys thereof and combinations thereof.

5. The apparatus of claim 4, wherein the metallic elements have a shape selected from the group consisting of spherical, cylindrical, conical, ellipsoidal, regular polyhedral, irregular polyhedral, derivatives thereof and combinations thereof.

6. The apparatus of claim 5, wherein the metallic elements have irregular polyhedral shapes the solid precursor material comprises pentakis(dimethylamino) tantalum.

7. The apparatus of claim 1, wherein at least one valve is disposed on the canister.

8. The apparatus of claim 7, wherein the at least one valve comprises a first valve coupled to an inlet of the canister for receiving a carrier gas and a second valve coupled to an outlet of the canister for dispensing a precursor gas.

9. The apparatus of claim 8, wherein the first valve is coupled to the delivery system by a first disconnect fitting and the second valve is coupled to the delivery system by a second disconnect fitting, wherein the first and second disconnect fittings facilitate removal of the canister.

10. The apparatus of claim 8, wherein a heater device is positioned to thermally contact the carrier gas prior to the carrier gas entering the inlet.

11. The apparatus of claim 10, wherein the heater device comprises a component selected from the group consisting of a heating element, a heater block, a cartridge heater, a heat transfer fluid, a surface heater, derivatives thereof and combinations thereof.

12. An apparatus for generating gas within a process system, comprising:
   a canister adapted for use in a gas panel of a delivery system connected to a process chamber;
   a source of a heated carrier gas connected to the canister; and
   a plurality of metallic elements in contact with a precursor material comprising pentakis(dimethylamino) tantalum contained within the canister.

13. The apparatus of claim 12, wherein the canister is a modular, isolatable, transportable canister.

14. The apparatus of claim 13, wherein at least one valve is disposed on the canister.

15. The apparatus of claim 14, wherein the at least one valve comprises a first valve coupled to an inlet of the canister for receiving a carrier gas and a second valve coupled to an outlet of the canister for dispensing a precursor gas.

16. The apparatus of claim 15, wherein the first valve is coupled to the delivery system by a first disconnect fitting and the second valve is coupled to the delivery system by a second disconnect fitting, wherein the first and second disconnect fittings facilitate removal of the canister.

17. The apparatus of claim 15, wherein a heater device is positioned to thermally contact the carrier gas prior to the carrier gas entering the inlet.

18. The apparatus of claim 17, wherein the heater device comprises a component selected from the group consisting of a heating element, a heater block, a cartridge heater, a heat transfer fluid, a surface heater, derivatives thereof and combinations thereof.

19. The apparatus of claim 12, wherein the metallic elements comprise a metal selected from the group consisting of stainless steel, aluminum, nickel, alloys thereof and combinations thereof.

20. The apparatus of claim 19, wherein the metallic elements have a shape selected from the group consisting of spherical, cylindrical, conical, ellipsoidal, regular polyhedral, irregular polyhedral, derivatives thereof and combinations thereof.

21. The apparatus of claim 20, wherein the metallic elements have irregular polyhedral shapes.

22. An apparatus for generating gas within a process system, comprising:
   a modular, isolatable, transportable canister adapted for use in a gas panel of a delivery system connected to a process chamber;
   at least one valve disposed on the canister and adapted for connecting to a delivery system; and
   a plurality of elements coated by a precursor material contained within the canister.

23. The apparatus of claim 22, wherein the at least one valve comprises a first valve coupled to an inlet of the canister for receiving a carrier gas and a second valve coupled to an outlet of the canister for dispensing a precursor gas.

24. The apparatus of claim 23, wherein the first valve is coupled to the delivery system by a first disconnect fitting and the second valve is coupled to the delivery system by a second disconnect fitting, wherein the first and second disconnect fittings facilitate removal of the canister.

25. The apparatus of claim 23, wherein a heater device is positioned to thermally contact the carrier gas prior to the carrier gas entering the inlet.

26. The apparatus of claim 25, wherein the heater device comprises a component selected from the group consisting of a heating element, a heater block, a cartridge heater, a heat transfer fluid, a surface heater, derivatives thereof and combinations thereof.

27. The apparatus of claim 22, wherein the precursor material comprises a compound selected from a group consisting of xenon difluoride, pentakis(dimethylamino) tantalum, nickel carbonyl, tungsten hexacarbonyl and derivatives thereof.

28. The apparatus of claim 22, wherein the precursor material comprises an element selected from the group consisting of tantalum, tungsten, nickel and fluorine.

29. The apparatus of claim 28, wherein the elements comprise a metal selected from the group consisting of stainless steel, aluminum, nickel, alloys thereof and combinations thereof.

30. The apparatus of claim 29, wherein the elements have a shape selected from the group consisting of spherical, cylindrical, conical, ellipsoidal, regular polyhedral, irregular polyhedral, derivatives thereof and combinations thereof.

31. The apparatus of claim 30, wherein the elements have irregular polyhedral shapes and the precursor material comprises pentakis(dimethylamino) tantalum.

32. An apparatus for generating gas within a process system, comprising:
   a modular, isolatable, transportable canister adapted for use in a gas panel of a delivery system connected to a process chamber;
   a first valve and an inlet disposed on the canister for receiving a carrier gas;
   a second valve and an outlet disposed on the canister for dispensing a precursor gas; and
   a plurality of metallic elements coated by a precursor material contained within the canister.

33. The apparatus of claim 32, wherein the first valve is coupled to the delivery system by a first disconnect fitting and the second valve is coupled to the delivery system by a second disconnect fitting, wherein the first and second disconnect fittings facilitate removal of the canister.

34. The apparatus of claim 32, wherein the metallic elements have irregular polyhedral shapes and the precursor material comprises pentakis(dimethylamino) tantalum.

* * * * *

UNITED STATES PATENT AND TRADEMARK OFFICE
CERTIFICATE OF CORRECTION

PATENT NO. : 7,294,208 B2
APPLICATION NO. : 11/146311
DATED : November 13, 2007
INVENTOR(S) : Rolf A. Guenther It is certified that error appears in the above-identified patent and that said Letters Patent is hereby corrected as shown below:

In references cited section (56):

Page 2, line 61 please delete "2001/0009695 A1 7/2001 Saanita et al" and insert --2001/0009695 A1 7/2001 Saanila et al--;

Page 2, line 62 please delete "2001/0013312 A1 8/2001 Soninen et al" and insert --2001/0013312 A1 8/2001 Soininen et al--;

Page 3, line 6 col. 2 please delete "2003/0101938 A1 6/2003 Ronsee et al" and insert --2003/0101938 A1 6/2003 Ronsse et al--.

Signed and Sealed this

Fourteenth Day of September, 2010

David J. Kappos
*Director of the United States Patent and Trademark Office*